US010292254B2

(12) United States Patent
Katz et al.

(10) Patent No.: US 10,292,254 B2
(45) Date of Patent: May 14, 2019

(54) CIRCUIT BOARD WITH CERAMIC INLAYS

(71) Applicant: Tesat-Spacecom GmbH & Co. KG, Backnang (DE)

(72) Inventors: Hanspeter Katz, Stuttgart (DE); Jochen Artmann, Weissach im Tal (DE); Eric Wolf, Waiblingen (DE); Christian Rapp, Backnang (DE); Ulrich Koeger, Gaildorf (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 0 days.

(21) Appl. No.: 14/551,680

(22) Filed: Nov. 24, 2014

(65) Prior Publication Data

US 2015/0146379 A1     May 28, 2015

(30) Foreign Application Priority Data

Nov. 25, 2013    (DE) ........................ 10 2013 019 617

(51) Int. Cl.
| | | |
|---|---|---|
| *H05K 1/02* | (2006.01) | |
| *H05K 1/11* | (2006.01) | |
| *H05K 1/18* | (2006.01) | |

(52) U.S. Cl.
CPC ......... *H05K 1/0204* (2013.01); *H05K 1/0207* (2013.01); *H05K 1/0298* (2013.01); *H05K 1/115* (2013.01); *H05K 1/181* (2013.01); *H05K 2201/10416* (2013.01)

(58) Field of Classification Search
CPC .............................. H05K 1/0204; H05K 1/181
USPC ......................................... 174/252; 257/678
See application file for complete search history.

(56) References Cited

U.S. PATENT DOCUMENTS

| | | | |
|---|---|---|---|
| 6,222,740 B1 | 4/2001 | Bovensiepen et al. | |
| 9,185,791 B2 * | 11/2015 | Wang ................... | H05K 1/0204 |
| 2003/0002260 A1 * | 1/2003 | Hasebe et al. ............... | 361/720 |
| 2007/0284711 A1 * | 12/2007 | Lee ..................... | H01L 23/3677 |
| | | | 257/678 |
| 2009/0266599 A1 * | 10/2009 | Kan ........................ | C23C 16/26 |
| | | | 174/263 |
| 2009/0301765 A1 | 12/2009 | Strauss et al. | |
| 2010/0103623 A1 * | 4/2010 | Kwank ................... | H01L 23/13 |
| | | | 361/709 |
| 2010/0200277 A1 | 8/2010 | Huang et al. | |

(Continued)

FOREIGN PATENT DOCUMENTS

| | | |
|---|---|---|
| CN | 101355070 A | 1/2009 |
| CN | 101686611 A | 3/2010 |

(Continued)

OTHER PUBLICATIONS

European Search Report dated Apr. 21, 2015, with partial English translation (two (2) pages).

(Continued)

*Primary Examiner* — Stanley Tso
(74) *Attorney, Agent, or Firm* — Crowell & Moring LLP

(57) ABSTRACT

A circuit board includes a plurality of conductive track levels disposed one above the other and insulation layers arranged between each of two adjacent conductive track levels. The circuit board includes a thermally conductive element, which includes ceramic, disposed between a first external insulation layer and a second external insulation layer.

13 Claims, 1 Drawing Sheet

(56) References Cited

U.S. PATENT DOCUMENTS

| | | | |
|---|---|---|---|
| 2011/0111537 A1* | 5/2011 | Cheng | H01L 33/641 |
| | | | 438/26 |
| 2012/0329183 A1 | 12/2012 | Wang | |
| 2014/0347821 A1 | 11/2014 | Bendani et al. | |

FOREIGN PATENT DOCUMENTS

| | | |
|---|---|---|
| CN | 102026496 A | 4/2011 |
| CN | 102625563 A | 8/2012 |
| DE | 10 2008 016 458 A1 | 1/2009 |
| DE | 20 2011 110 068 U1 | 1/2013 |
| EP | 0 926 929 A1 | 6/1999 |
| EP | 1 261 028 A2 | 11/2002 |
| EP | 1 276 357 A2 | 1/2003 |
| EP | 2 227 076 A1 | 9/2010 |
| FR | 2 984 679 A1 | 6/2013 |
| FR | 2 984 680 A1 | 6/2013 |
| JP | 64-9644 A | 1/1989 |
| JP | 5-82929 A | 4/1993 |
| JP | 8-148839 A | 6/1996 |
| JP | 10-256685 A | 9/1998 |
| WO | WO 2010/034194 A1 | 4/2010 |

OTHER PUBLICATIONS

Chinese Office Action issued in Chinese counterpart application No. 201410684302.5 dated Mar. 19, 2018, with partial English translation (Fifteen (15) pages).

Japanese Office Action issued in Japanese counterpart application No. 2014-236274 dated Aug. 28, 2018, with English translation (Seven (7) pages).

* cited by examiner

CIRCUIT BOARD WITH CERAMIC INLAYS

CROSS-REFERENCE TO RELATED APPLICATIONS

The present application claims priority under 35 U.S.C. § 119 to German application 10 2013 019 617.5, filed Nov. 25, 2013, the entire disclosure of which is herein expressly incorporated by reference.

TECHNICAL FIELD OF THE INVENTION

Exemplary embodiments of the invention relate to a circuit board, in particular a multi-layer electrical circuit board to accommodate electrical components, as well as an electrical component with such a circuit board.

BACKGROUND OF THE INVENTION

For implementation of electrical modules or components used in the context of electrical or electronic assemblies or devices, circuit boards are equipped with electrical or electronic components. In this case the circuit boards serve for mechanical fixing and for electrical coupling of components disposed on a circuit board. The electrical connections are produced by means of conductive tracks, for example copper conductive tracks.

An epoxy-glass mixture is usually used as circuit board material. In this case a circuit board may be of multi-layer construction and may have a plurality of conductive track levels or layers. In this way it is possible that each conductive track level or layer is provided individually with electrically conductive tracks, so that the number of possible electrical connections between the components disposed on the circuit board can be increased.

A conductive track level or layer may have a recess or an opening that enables the production of an electrical connection between conductive tracks on different conductive track levels, for example in that the recess or the opening is coated with electrically conductive material or an electrically conductive material is disposed in the recess or the opening and is electrically connected to the conductive tracks which are to be connected.

European patent document EP 0 926 929 A1 describes a multilayer circuit board with a plurality of conductive track levels disposed one above the other and separated by insulating material layers. A core substrate, which adapts the thermal expansion properties of the multilayer circuit board to thermal expansion properties of a component disposed on the multilayer circuit board, is disposed between the external insulating material layers. The core substrate is made of molybdenum.

SUMMARY OF THE INVENTION

Exemplary embodiments of the present invention provide a circuit board having high thermal conductivity and improved high voltage insulation.

According to a first aspect a circuit board is designed to be equipped with electrical components. The circuit board has a plurality of conductive track levels disposed one above the other, wherein in each case two adjacent conductive track levels are insulated from one another by an insulation layer. A thermally conductive element is disposed between a first external insulation layer and a second external insulation layer, wherein the thermally conductive element includes ceramic.

The basic geometric construction of the circuit board corresponds to a so-called sandwich structure, wherein in a depth direction of the circuit board electrically conductive layers, the conductive track levels, alternate with electrically insulating layers, the insulation layers.

A core that is thermally conductive and is made of ceramic is disposed within the circuit board, which is to say in the depth direction between a first external insulation layer and a second external insulation layer.

In this case the electrical components may be disposed on the first external surface. Due to its properties and its arrangement within the circuit board, the thermally conductive element enables thermal conduction, in particular heat dissipation, from the first external surface and the electrical components to the second external surface, which is disposed for example opposite the first external surface or also transversely with respect thereto.

Ceramic is suitable for use as a thermally conductive element, since it enables not only good heat conductivity properties but generally also good voltage insulation, in particular high voltage insulation, and has advantageous mechanical properties with regard to its rigidity.

Thus a circuit board such as is described above and below may be advantageous in particular for uses in high voltage installations and in a vacuum. Such a scenario occurs for example in the field of use of satellites which are located in airless space.

Thermal energy can be dissipated as heat flux in a solid material as a result of a temperature difference (thermal diffusion or conduction) or through a macroscopic material stream (convection) from a heat source in the direction of a heat sink. In addition heat can also be transported by thermal radiation.

In airless or almost airless space thermal energy cannot be transmitted by means of convection, since for example there is no air stream for transport of the thermal energy. Thus when technical and/or electrical instruments are used in airless space any necessary cooling of electrical components cannot take place by convection. Thus thermal conduction in airless space is limited to conduction and thermal radiation.

Ceramic is on the one hand a good thermal conductor and thus can transport thermal energy by conduction. On the other hand ceramic also meets requirements with regard to high voltage insulation, so that the circuit board as described above and below is suitable in particular for use in a power amplifier in satellites.

The ceramic of the thermally conductive element can have a higher thermal conductivity than the material of the insulation layers of the circuit board.

According to an embodiment the thermally conductive element includes aluminum nitride. Aluminum nitrite is characterized by a particularly good thermal conductivity.

According to a further embodiment the thermally conductive element is designed to be electrically insulating. As a rule good thermal conductors are also electrically conductive. This is not the case as a rule with ceramic and thus this material constitutes an advantageous combination of good thermally conductivity and electrical insulation.

According to a further embodiment the thermally conductive element is disposed in a recess in an insulation layer.

The circuit board may be of multi-layer construction, wherein the insulation layers are thicker in the depth direction than the conductive tracks. If in one of the internal insulation layers a recess or even an opening is provided, then the thermally conductive element can be disposed as the core of the circuit board without any change to the outwardly visible geometric dimensions of the circuit board.

Furthermore the thermally conductive element is fixed in its position by the recess. The recess may be a depression in an insulation layer or an opening through an insulation layer.

The recess may also extend in the depth direction of the circuit board even over more than one insulation layer.

According to a further embodiment a first surface of the thermally conductive element adjoins a first conductive track level in the depth direction of the circuit board.

Since the first conductive track level is usually provided with an electrically conductive material, it also has a high thermal conductivity. Thus the thermal energy can be further transported from the first surface of the circuit board via the conductive tracks of the conductive track level to the thermally conductive element conveyed and through the latter.

In one embodiment conductive tracks of the conductive track level extend on or along the first surface of the thermally conductive elements.

According to a further embodiment a second surface of the thermally conductive element adjoins a second conductive track level in the depth direction of the circuit board.

For this purpose the same statements apply analogously as for the first surface of the thermally conductive element, in particular also relating to the arrangement of the conductive tracks of the second conductive track level with respect to the second surface.

Thus thermal energy can be routed through conductive tracks of a first conductive track level to the thermally conductive element and thermal energy can be routed through conductive tracks of a second conductive track level away from the thermally conductive element.

According to a further embodiment the thermally conductive element extends over more than one insulation layer in the depth direction of the circuit board.

According to a further aspect an electrical component is specified for use in a satellite. The electrical component has a circuit board as described above and below and an electrical component that is mechanically and electrically coupled to an equipment layer of the circuit board. In this case the thermally conductive element is disposed so that it overlaps the electrical component in the longitudinal direction of the circuit board The electrical component may, for example, be a power amplifier for a satellite, for example a power amplifier in the form of a travelling wave tube amplifier. One such amplifier consists of a travelling wave tube that predominantly determines the HF properties and a current supply which generates the supply voltages, predominantly high voltages, and constitutes a telemetry and telecommand interface to the satellite.

Series-connected rectifier stages can be used for the generation of the high voltages necessary for operation. These include lossy rectifier diodes, which for their part are insulated against high voltage by the series connection with respect to a heat sink, for example a housing. Due to the absence of air or another ambient gas and thus the lack of a possibility of convection cooling, for spacecraft the accruing power loss of the electrical components, that is to say the excess thermal energy, must be discharged via the circuit board, that is to say by conduction and by means of thermal radiation.

Overlapping means that a perpendicular projection of the electrical component onto a surface of the circuit board (designated as a projection surface or, limited to the longitudinal direction, as a longitudinal projection) has an overlap region with a perpendicular projection of the thermally conductive element onto the same surface of the circuit board.

In this case the thermally conductive element can overlap the electrically conductive component at least partially, completely or exactly. A complete overlap means that the thermally conductive element has a longitudinal projection that is greater than the longitudinal projection of the electrical component. An exact overlap means that these two longitudinal projections are identical and overlap without overhang, that is to say they are congruent. In the case of a partial overlap the longitudinal projections may be identical or different and are offset from one another.

According to one embodiment the thermally conductive element is disposed so that it overlaps the electrical component in the transverse direction of the circuit board This involves an overlap of the transverse projections and the statements relating to the overlap of the longitudinal projections apply analogously, also with regard to the partial, complete and exact overlap.

According to a further embodiment the electrical component has a thermal coupling element that is thermally coupled to an external layer the circuit board and is designed to discharge heat from the circuit board, wherein the thermally conductive element is disposed so that it overlaps the thermal coupling element in the longitudinal direction of the circuit board.

The external layer is disposed opposite the equipment layer. This results in a thermal flux from the electrical component via the equipment layer, the thermally conductive elements, the external layer and the thermal coupling element.

The thermal coupling element is designed to be electrically, mechanically and thermally coupled for example to a housing of the electrical component.

With regard to the overlap of the thermally conductive element and the thermal coupling element, the statements with regard to the overlap of the longitudinal and transverse projections of the electrical component and of the thermally conductive element apply analogously.

BRIEF DESCRIPTION OF THE DRAWING FIGURES

Embodiments of the invention are described in greater detail below with reference to the appended drawings. In the drawings.

DETAILED DESCRIPTION

Figure 1:
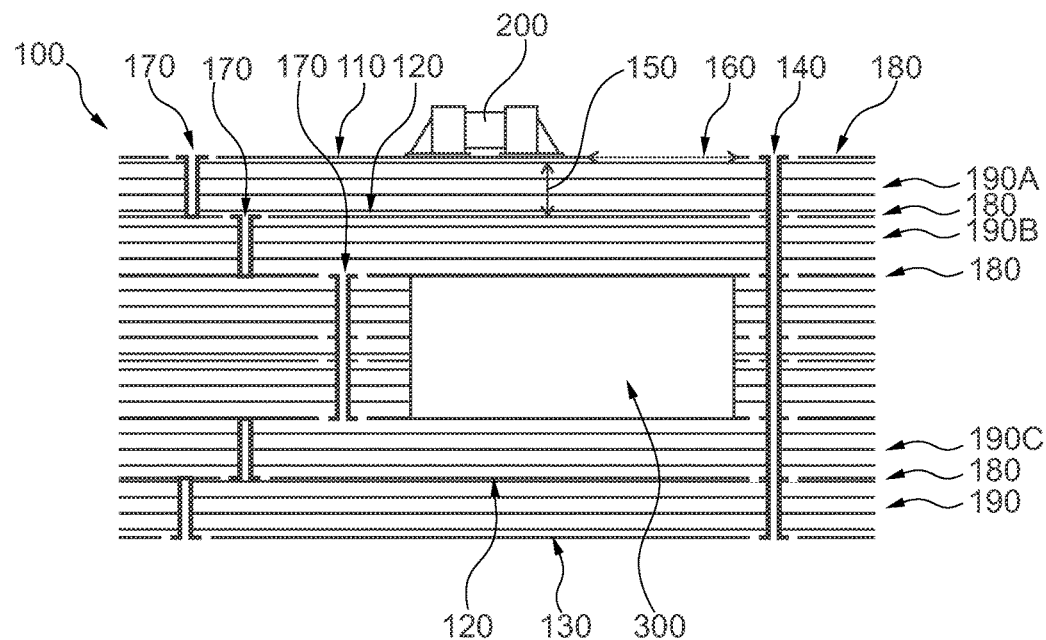
FIG. 1 shows a schematic representation of a cross-section of a circuit board according to one embodiment.

FIG. 1 shows a circuit board 100 built up in layers with a plurality of conductive track levels 180, which is constructed as an electrically conductive layer, for example made of copper or copper foils. An insulation layer 190A, 190B, 190C, 190D is disposed in each case between two adjacent conductive track levels 180 in the depth direction of the circuit board.

The electrical connection between adjacent conductive track levels may be produced for example by a layer connection 170, which extends in the depth direction of the circuit board 100 between conductive track levels.

An electrical component 200 is coupled to the equipment layer 110. An internal layer 120 has a layer spacing 150 with respect to the equipment layer. The layer spacing 150 corresponds to the thickness of an insulation layer 190A.

The electrical component 200 has an insulation spacing 160 running laterally to a fastening sleeve 140 of the circuit board.

An external layer 130 is disposed on a surface of the circuit board 100 opposite the equipment layer 110.

In the illustrated embodiment the circuit board 100 has six insulation layers. A recess in which the thermally conductive element 300 is located is disposed in the two insulation layers disposed centrally in the depth direction.

The thermally conductive element 300 extends over two insulation layers in the depth direction of the circuit board 100.

Figure 2:
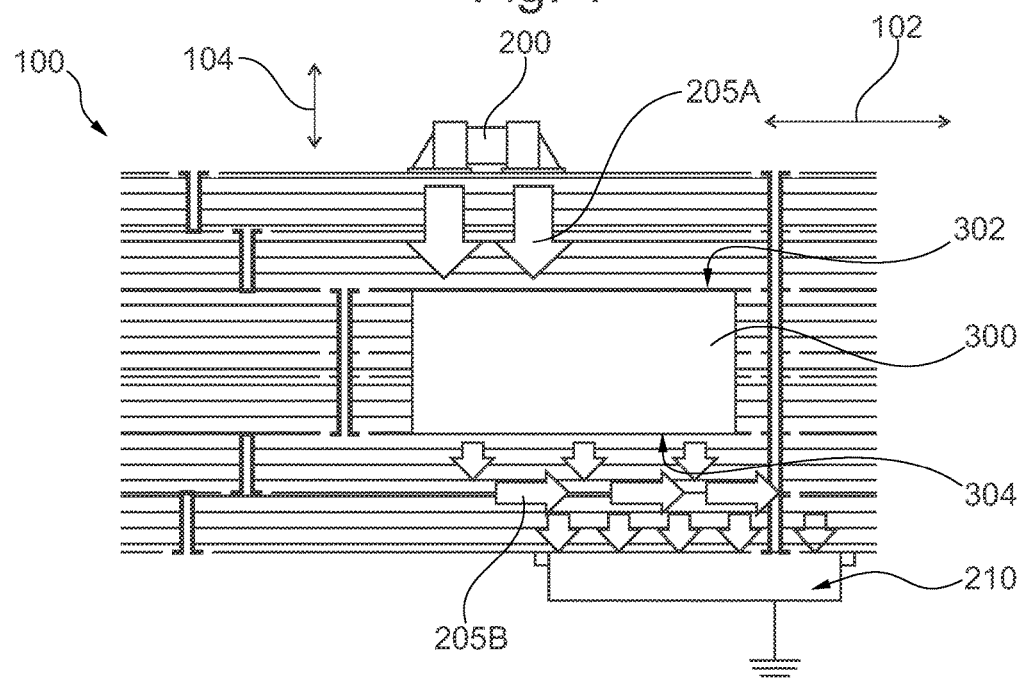
FIG. 2 shows a schematic representation of a cross-section of a circuit board according to a further embodiment.

FIG. 2 shows the heat flux in a circuit board 100 from the electrical component 200 via the circuit board 100 and the thermally conductive element 300 to a thermal coupling element 210.

The longitudinal direction 102 of the circuit board 100 extends in the drawing plane of FIG. 2 from left to right. A projection of the thermally conductive element 300 onto the equipment layer overlaps, in the longitudinal direction, a projection of the electrical component 200 onto the equipment layer. The same applies to the projections of the thermally conductive element 300 and of the thermal coupling element 210 onto the external layer 130.

The depth direction 104 of the circuit board 100 extends in the drawing plane of FIG. 2 from top to bottom. The heat flux 205A, 205B is indicated by arrows.

The transverse direction of the circuit board extends perpendicular to the depth direction and to the longitudinal direction, which is to say into the drawing plane of FIG. 2.

A first surface 302 and a second surface 304 of the thermally conductive element 300 in each case adjoin a conductive track level between two adjacent insulation layers.

In other words the heat flux 205A, 205B may be described as follows: The heat emitted by the power loss of a lossy component 200 operated at high voltage can be introduced via the equipment layer 110 and internal layer 120 and via the insulation layers into the ceramic core 300. An advantageous spread of the emitted heat can be controlled by variation of the thickness of copper foils forming the conductive tracks. The ceramic core directs the heat to the next spreading copper foil, i.e. to the second surface 304, and to the thermal coupling element 210, without a predetermined high voltage loading or field strength constant loading being exceeded. By taking into consideration the creepage distance requirements on the surface and an insulation spacing 160 associated therewith as well as the intralayer spacings 150, a voltage flashover between the component 200 and the mechanical/thermal attachment 140 can be prevented.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A multi-layered printed circuit board for use in high voltage installations under vacuum conditions and configured to carry electrical components, the printed circuit board comprising:
   a plurality of electrically conductive track layers disposed one above the other;
   a plurality of insulation layers, each single insulation layer respectively arranged between each adjacent electrically conductive track layer of the plurality of electrically conductive track layers, so that the electrically conductive layers alternate with the insulation layers;
   a thermally conductive element disposed between a first external insulation layer and a second external insulation layer of the insulation layers arranged between adjacent electrically conductive track layers of the plurality of electrically conductive track layers; and
   an equipment layer to which an electrical component is mechanically and electrically coupled,
   wherein the thermally conductive element includes ceramic and provides electrical insulation,
   wherein the thermally conductive element is disposed in a recess that extends over more than one insulation layer in a depth direction of the printed circuit board,
   wherein a first surface and a second surface of the thermally conductive element in each case adjoin a conductive track level between two adjacent insulation layers, and
   wherein the thermally conductive element is disposed so that it congruently overlaps the electrical component without overhang in a longitudinal direction of the printed circuit board.

2. The printed circuit board of claim 1, wherein the thermally conductive element also includes aluminium nitride.

3. The printed circuit board of claim 1, the thermally conductive element is electrically insulating.

4. The printed circuit board of claim 1, wherein the thermally conductive element is disposed in a recess in one of the insulation layers arranged between said each adjacent electrically conductive track layer.

5. The printed circuit board of claim 1, wherein a first surface of the thermally conductive element adjoins a first electrically conductive track layer, of the plurality of electrically conductive track layers, in the depth direction of the printed circuit board.

6. The printed circuit board of claim 5, wherein a second surface of the thermally conductive element adjoins a second electrically conductive track layer, of the plurality of electrically conductive track layers, in the depth direction of the printed circuit board.

7. An electrical component in a satellite, wherein the electrical component comprises:
   a multi-layered printed circuit board comprising:
      a plurality of electrically conductive track layers disposed one above the other;
      one or more insulation layers, each single insulation layer respectively arranged between each adjacent electrically conductive track layer of the plurality of electrically conductive track layers, so that the electrically conductive layers alternate with the insulation layers; and
      a thermally conductive element disposed between a first external insulation layer and a second external insulation layer of the insulation layers arranged between adjacent electrically conductive track layers of the plurality of electrically conductive track layers,
      wherein the thermally conductive element includes ceramic and provides electrical insulation under vacuum conditions;
   an electrical component mechanically and electrically coupled to an equipment layer of the printed circuit board, wherein the thermally conductive element is disposed so that it congruently overlaps the electrical component without overhang in a longitudinal direction of the printed circuit board; and
a thermal coupling element that is thermally coupled to an external layer of the printed circuit board and is configured to discharge heat from the printed circuit board,
wherein the thermally conductive element is disposed so that it overlaps the thermal coupling element in the longitudinal direction of the printed circuit board,
wherein the thermal coupling element extends along a longitudinal direction of a bottom surface of the printed circuit board,
wherein the bottom surface extends in parallel to the equipment layer to which the electrical component is coupled,
wherein the thermally conductive element is disposed in a recess that extends over more than one insulation layer in a depth direction of the printed circuit board, and
wherein a first surface and a second surface of the thermally conductive element in each case adjoin a conductive track level between two adjacent insulation layers.

8. The electrical component of claim 7, wherein the thermally conductive element is disposed so that it overlaps the electrical component in a transverse direction of the printed circuit board.

9. The electrical component of claim 7, wherein the thermally conductive element also includes aluminium nitride.

10. The electrical component of claim 7, wherein the thermally conductive element is electrically insulating.

11. The electrical component of claim 7, wherein the thermally conductive element is disposed in a recess in one of the insulation layers arranged between said each adjacent electrically conductive track layer.

12. The electrical component of claim 7, wherein a first surface of the thermally conductive element adjoins a first electrically conductive track layer, of the plurality of electrically conductive track layers, in the depth direction of the printed circuit board.

13. The electrical component of claim 12, wherein a second surface of the thermally conductive element adjoins a second electrically conductive track layer, of the plurality of electrically conductive track layers, in the depth direction of the printed circuit board.

* * * * *